United States Patent
Wang et al.

(10) Patent No.: US 10,177,332 B2
(45) Date of Patent: Jan. 8, 2019

(54) ORGANIC LIGHT-EMITTING DISPLAY PANEL AND DEVICE

(71) Applicant: SHANGHAI TIANMA AM-OLED CO., LTD., Shanghai (CN)

(72) Inventors: Xiangcheng Wang, Shanghai (CN); Jinghua Niu, Shanghai (CN); Yuji Hamada, Shanghai (CN); Wei He, Shanghai (CN); Wanming Hua, Shanghai (CN); Shuang Cheng, Shanghai (CN)

(73) Assignee: SHANGHAI TIANMA AM-OLED CO., LTD., Shanghai (CN)

(*) Notice: Subject to any disclaimer, the term of this patent is extended or adjusted under 35 U.S.C. 154(b) by 0 days.

(21) Appl. No.: 15/717,798

(22) Filed: Sep. 27, 2017

(65) Prior Publication Data

US 2018/0033996 A1    Feb. 1, 2018

(30) Foreign Application Priority Data

Jan. 16, 2017    (CN) .......................... 2017 1 0028398

(51) Int. Cl.
*H01L 51/50*    (2006.01)

(52) U.S. Cl.
CPC ........ *H01L 51/5064* (2013.01); *H01L 51/506* (2013.01); *H01L 51/5076* (2013.01); *H01L 2251/5353* (2013.01); *H01L 2251/552* (2013.01); *H01L 2251/558* (2013.01)

(58) Field of Classification Search
CPC ............... H01L 51/506; H01L 51/5064; H01L 51/5076; H01L 2251/5353
See application file for complete search history.

(56) References Cited

U.S. PATENT DOCUMENTS

| 2008/0042556 A1* | 2/2008 | Chu | H01L 51/5092 |
| | | | 313/504 |
| 2008/0246394 A1* | 10/2008 | Fukuda | G02B 6/4201 |
| | | | 313/504 |
| 2014/0234999 A1* | 8/2014 | Kim | C09K 11/02 |
| | | | 438/26 |

(Continued)

FOREIGN PATENT DOCUMENTS

| CN | 101692484 A | 4/2010 |
| CN | 102694125 A | 9/2012 |

(Continued)

OTHER PUBLICATIONS

CN second Office Action, dated Apr. 20, 2018.

*Primary Examiner* — Phuc T Dang

(74) *Attorney, Agent, or Firm* — Alston & Bird LLP

(57) ABSTRACT

Disclosed are an organic light-emitting display panel and an organic light-emitting display device. The organic light-emitting display panel comprises: a substrate, a second electrode, a light-emitting layer, a first hole transport layer and a first electrode that are successively laminated, wherein, the materials of both the first electrode and the second electrode are silver or silver-containing metallic materials, the material of the first hole transport layer is a conductive material doped with a P-type semiconductor material and a P-type semiconductor material layer is set between the first hole transport layer and the first electrode.

20 Claims, 10 Drawing Sheets

(56) References Cited

U.S. PATENT DOCUMENTS

| | | | |
|---|---|---|---|
| 2016/0027860 A1* | 1/2016 | Yamamoto | H01L 51/56 |
| | | | 257/40 |
| 2016/0035980 A1* | 2/2016 | Kong | H01L 51/5228 |
| | | | 257/40 |
| 2016/0248019 A1* | 8/2016 | Choi | H01L 51/0059 |
| 2017/0098782 A1* | 4/2017 | Choi | H01L 51/508 |
| 2017/0263876 A1* | 9/2017 | Kim | H01L 51/504 |

FOREIGN PATENT DOCUMENTS

| | | |
|---|---|---|
| CN | 103378297 A | 10/2013 |
| CN | 103594659 A | 2/2014 |
| CN | 103927042 A | 7/2014 |
| CN | 104051653 A | 9/2014 |
| CN | 105845834 A | 8/2016 |

* cited by examiner

ORGANIC LIGHT-EMITTING DISPLAY PANEL AND DEVICE

CROSS-REFERENCE TO RELATED APPLICATIONS

This application claims priority to Chinese Patent Application No. CN201710028398.3, filed on Jan. 16, 2017 and entitled "ORGANIC LIGHT-EMITTING DISPLAY PANEL AND DEVICE", the disclosure of which is incorporated herein by reference in its entirety.

TECHNICAL FIELD

Embodiments of the present disclosure relate to organic light-emitting display technologies, and in particular, to an organic light-emitting display panel and an organic light-emitting display device.

BACKGROUND

Organic Light-Emitting Display has become one of the important development directions in display industries, because of its the technical advantages of no backlight source, high contrast, small thickness, large visual angle and fast reaction speed, etc.

The existing organic light-emitting display panels are mainly divided into upright organic light-emitting display panels and inverted organic light-emitting display panels. Among them, an upright organic light-emitting display panel includes a substrate, an anode, a light-emitting layer and a cathode that are successively laminated. Although such a structure of the organic light-emitting display panel can adjust charge balance well, the active metal in the cathode tends to be eroded by water and oxygen, causing a very short lifetime of the organic light-emitting display panel. The inverted organic light-emitting display panel includes a substrate, a cathode, a light-emitting layer and an anode that are successively laminated. In the inverted organic light-emitting display panel, the active metal in the cathode may be well protected from being eroded by water and oxygen; however, in such an organic light-emitting display panel, it is very hard to achieve a balanced adjustment of hole injection and electron injection, therefore a very high bias voltage is needed, and the light-emitting efficiency is much lower than that of the upright organic light-emitting display panel, so that it cannot meet the requirements on organic light-emitting display panels in the market.

SUMMARY

The present disclosure provides an organic light-emitting display panel and an organic light-emitting display device, which enable adjusting the charge balance in the organic light-emitting display panel, to lower the bias voltage required for the organic light-emitting display panel, thereby improving the light-emitting efficiency of the organic light-emitting display panel and prolonging the lifetime of the organic light-emitting display panel.

In a first aspect, embodiments of the present disclosure provide an organic light-emitting display panel, which includes:

a substrate, a second electrode, a light-emitting layer, a first hole transport layer and a first electrode that are successively laminated;

wherein, the first electrode and the second electrode are both made of silver or silver-containing metallic materials, the material of the first hole transport layer is a conductive material doped with a P-type semiconductor material, and a P-type semiconductor material layer is set between the first hole transport layer and the first electrode.

In a second aspect, embodiments of the present disclosure further provide an organic light-emitting display device, which includes any organic light-emitting display panel according to the embodiments of the present disclosure.

In the embodiments of the present disclosure, the first electrode and the second electrode are both made of silver or silver-containing metallic material, the material of the first hole transport layer is a conductive material doped with a P-type semiconductor material, and a P-type semiconductor material layer is provided between the first hole transport layer and the first electrode. With such an arrangement, it solves the problems of existing inverted organic light-emitting display panel of being very hard to achieve balanced adjustment of hole injection and electron injection leading to high bias voltage required for the organic light-emitting display panel, low light-emitting efficiency and short lifetime. With the organic light-emitting display panel and the organic light-emitting display device built according to the embodiments of the present disclosure, one can adjust the charge balance in the organic light-emitting display panel to lower the bias voltage required for the organic light-emitting display panel, thus improving the light-emitting efficiency of the organic light-emitting display panel and prolonging the lifetime of the organic light-emitting display panel.

DETAILED DESCRIPTION

The present disclosure will be further illustrated in detail in conjunction with the drawings and embodiments. It may be understood that, the specific embodiments described here are only set for explaining, rather than limiting, the present disclosure. Additionally, it further needs to be noted that, for convenient description, the drawings only show the parts related to the disclosure, rather than the whole structure.

One embodiment of the application provides an organic light-emitting display panel, which includes: a substrate, a second electrode, a light-emitting layer, a first hole transport layer and a first electrode that are successively laminated; wherein, the material of both the first electrode and the second electrode is silver or silver-containing metallic material, and the material of the first hole transport layer is a conductive material doped with a P-type semiconductor material, or a P-type semiconductor material layer is provided between the first hole transport layer and the first electrode. The first electrode is an anode, and the second electrode is a cathode.

In the embodiment of the present disclosure, the material of both the first electrode and the second electrode is silver or a silver-containing metallic material, the material of the first hole transport layer is a conductive material doped with a P-type semiconductor material, and a P-type semiconductor material layer is provided between the first hole transport layer and the first electrode, so that it solves the problem in the related art that in the existing inverted organic light-emitting display panel where it is very hard to achieve the balanced adjustment of hole injection and electron injection, causing high bias voltage required for the organic light-emitting display panel, low the light-emitting efficiency and the short lifetime. With the organic light-emitting display panel built according to the embodiments of the present disclosure, one can adjust the charge balance in the organic light-emitting display panel, and lower the bias voltage required for the organic light-emitting display panel, thereby improving the light-emitting efficiency of the organic light-emitting display panel and prolonging the lifetime of the organic light-emitting display panel.

Figure 1:
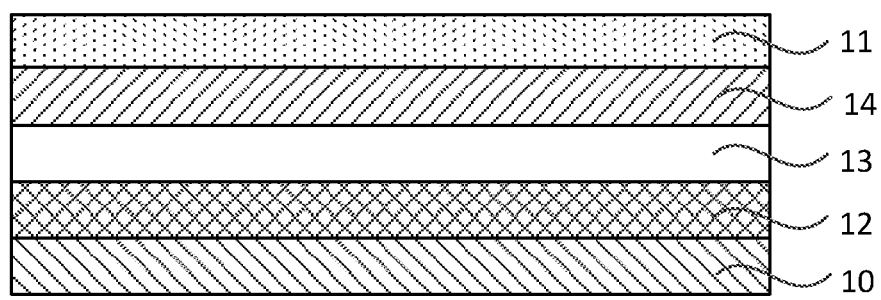
FIG. 1 is a cross sectional view of a structure of an organic light-emitting display panel according to one embodiment of the present disclosure.

FIG. 1 is a cross sectional view of a structure of an organic light-emitting display panel according to one embodiment of the present disclosure. Referring to FIG. 1, the organic light-emitting display panel includes: a substrate 10, a second electrode 12, a light-emitting layer 13, a first hole transport layer 14 and a first electrode 11 that are successively laminated. The materials of both the first electrode 11 and the second electrode 12 are silver or silver-containing metallic materials, and the material of the first hole transport layer 14 is conductive material (host) doped with a P-type semiconductor material (dopant). The first electrode is an anode, and the second electrode is a cathode.

During operation, a bias voltage is applied between the first electrode 11 and the second electrode 12 of the organic light-emitting display panel, so that holes are injected from the first electrode 11 and migrate toward the light-emitting layer 13 via the first hole transport layer 14, and electrons are injected from the second electrode 12 and migrate toward the light-emitting layer 13. On the light-emitting layer 13, the holes and the electrons are recombined to generate excitons. The excitons are unstable, and hence energy can be released. The energy is transferred to the molecules of the organic light-emitting material in the light-emitting layer 13, so that the molecules transit from a ground state to an excited state. The excited state is very unstable, and thus the excited molecules return to the ground state from the excited state, so that a light emitting phenomenon appears due to radiative transition. Therefore, in the organic light-emitting display panel, the performance of the organic light-emitting display panel is determined by the hole-electron recombination efficiency. Moreover, the injection situation of the holes and the electrons affects the hole-electron recombination efficiency.

It may be known according to Fowler-Nordheim (FN) tunneling model that, the material of both the first electrode 11 and the second electrode 12 is silver or silver-containing metallic material, and the material of the first hole transport layer 14 is conductive material doped with a P-type semiconductor material. In such an arrangement, it contributes to lower the interfacial energy barrier between the first electrode 11 and the first hole transport layer 14, improve the hole injection capacity and facilitate hole injection, and also it is favorable to adjust the charge balance in the organic light-emitting display panel and lower the bias voltage required for the organic light-emitting display panel, thereby improving the light-emitting efficiency of the organic light-emitting display panel and prolonging the lifetime of the organic light-emitting display panel.

In a specific arrangement, the appropriate mass percent of the P-type semiconductor material and the appropriate thickness of the first hole transport layer 14 may be selected according to the performance requirements of the organic light-emitting display panel to be manufactured. Optionally, the mass percent of the P-type semiconductor material in the first hole transport layer 14 may be greater than or equal to 1% but less than or equal to 10%. The thickness of the first hole transport layer 14 may be greater than or equal to 50 Å but less than or equal to 300 Å.

The transport of holes in the first hole transport layer 14 is essentially realized by filling the holes with electrons in turn in a certain direction. Specifically, under the action of the electric field, electrons located on the highest occupied molecular orbit (HOMO) energy level in the first hole transport layer 14 transit to the lowest unoccupied molecular orbit (LUMO) energy level of the P-type semiconductor material and fill the holes near the first electrode 11, thereby forming new holes that are nearer to the light-emitting layer 13. Therefore, the nearer the lowest unoccupied molecular orbit (LUMO) energy level of the P-type semiconductor material is to the highest occupied molecular orbit (HOMO) energy level of the first hole transport layer 14, the easier it will be for the generation of holes. Optionally, the lowest unoccupied molecular orbit (LUMO) energy level of the P-type semiconductor material is less than −5 eV.

Figure 2:
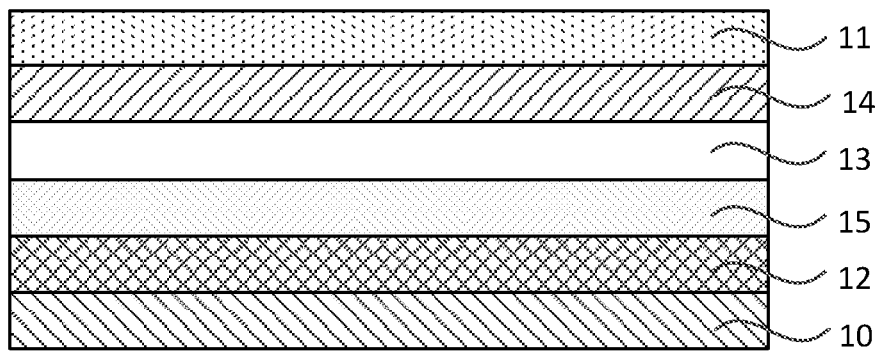
FIG. 2 is a cross sectional view of a structure of another organic light-emitting display panel according to one embodiment of the present disclosure.

FIG. 2 is a cross sectional view of a structure of another organic light-emitting display panel according to one embodiment of the present disclosure. In comparison with FIG. 1, the organic light-emitting display panel provided in FIG. 2 further includes an electron transport layer 15. Specifically, referring to FIG. 2, the electron transport layer 15 is located between the second electrode 12 and the light-emitting layer 13.

Optionally, the electron transport layer 15 is doped with at least one of an alkali metal, an alkaline earth metal or a rare earth metal. Exemplarily, the electron transport layer 15 is doped with at least one of lithium, cesium and ytterbium. With such an arrangement, the interfacial energy barrier between the first electrode 11 and the organic material (for example, the light-emitting layer 13) of the organic light-emitting display panel may be lowered, thereby improving the electron injection capacity, facilitating the adjustment of the charge balance in the organic light-emitting display panel and lowering the bias voltage required for the organic light-emitting display panel, so that it improves the light-emitting efficiency of the organic light-emitting display panel. In specific arrangement, appropriate mass percent of the metal doped in the electron transport layer 15 and appropriate thickness of the electron transport layer 15 may be selected according to the performance requirements of the organic light-emitting display panel to be manufactured. Optionally, the mass percent of the metal doped in the electron transport layer 15 ranges from 5% to 50%, and the thickness of the electron transport layer 15 is greater than 200 Å.

It should be noted that, in specific arrangement, in order to adjust the charge balance in the organic light-emitting display panel, it needs to be considered comprehensively rather than independently, when determining the mass percent of the P-type semiconductor material in the first hole transport layer 14, the thickness of the first hole transport layer 14, the mass percent of the metal doped in the electron transport layer 15 and the thickness of the electron transport layer 15.

Figure 3:
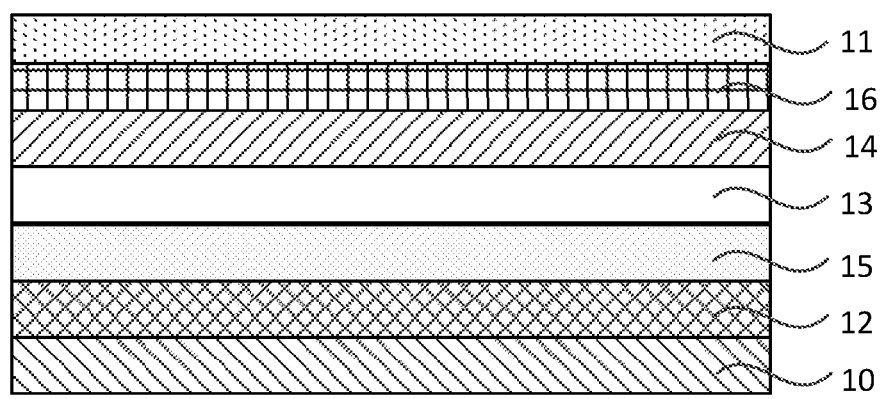
FIG. 3 is a cross sectional view of a structure of yet another organic light-emitting display panel according to one embodiment of the present disclosure.

FIG. 3 is a structural representation of another organic light-emitting display panel according to one embodiment of the present disclosure. In comparison with FIG. 2, the first hole transport layer 14 in the organic light-emitting display panel of FIG. 3 is not doped with P-type semiconductor material; instead, a P-type semiconductor material layer 16 is provided between the first hole transport layer 14 and the first electrode 11.

Similarly, it is known according to Fowler-Nordheim (FN) tunneling model that, by setting the material of both the first electrode 11 and the second electrode 12 as silver or a silver-containing metallic material and providing a P-type semiconductor material layer 16 between the first hole transport layer 14 and the first electrode 11, it helps to lower the interfacial energy barrier between the first electrode 11 and the first hole transport layer 14, thereby improving the hole injection capacity and facilitate hole injection.

In specific arrangement, the P-type semiconductor material layer with an appropriate thickness may be manufactured according to the performance requirement of the organic light-emitting display panel to be manufactured.

The transport of holes in the first hole transport layer 14 is essentially realized by filling the holes with electrons in turn in a certain direction. Specifically, under the action of the electric field, electrons located on the highest occupied molecular orbit (HOMO) energy level in the first hole transport layer 14 transit to the lowest unoccupied molecular orbit (LUMO) energy level of the P-type semiconductor material and fill the holes near the first electrode 11, thereby forming new holes that are nearer to the light-emitting layer 13. Therefore, the nearer the lowest unoccupied molecular orbit (LUMO) energy level of the P-type semiconductor material is to the highest occupied molecular orbit (HOMO) energy level of the first hole transport layer 14, the easier it will be for the generation of holes. Optionally, the lowest unoccupied molecular orbit (LUMO) energy level of the P-type semiconductor material is less than −5 eV.

Similarly, the electron transport layer 15 may be doped with at least one of an alkali metal, an alkaline earth metal and a rare earth metal. In specific arrangement, in order to adjust the charge balance in the organic light-emitting display panel, it needs to be considered comprehensively rather than independently, when determining the thickness of the P-type semiconductor material layer, the mass percent of the metal doped in the electron transport layer 15 and the thickness of the electron transport layer 15.

Figure 4:
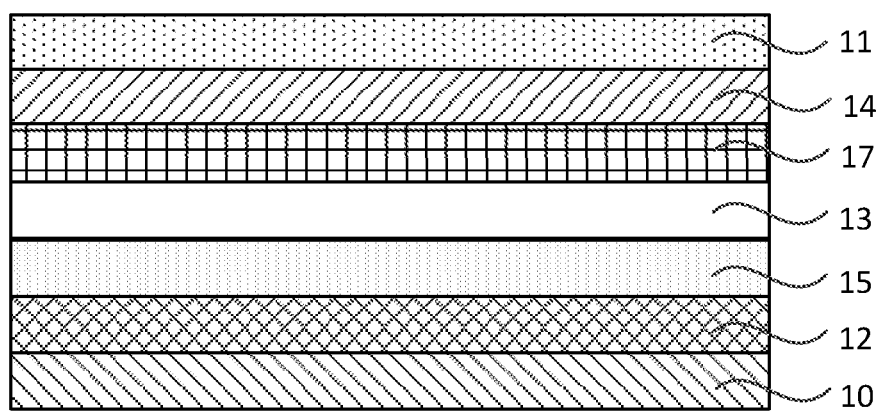
FIG. 4 is a cross sectional view of a structure of yet another organic light-emitting display panel according to one embodiment of the present disclosure.

FIG. 4 is a cross sectional view of a structure of yet another organic light-emitting display panel according to one embodiment of the present disclosure. Referring to FIG. 4, the organic light-emitting display panel further includes a second hole transport layer 17, which is located between the first hole transport layer 14 and the light-emitting layer 13. Optionally, in order to lower the interfacial energy barrier between the first hole transport layer 14 and the second hole transport layer 17, the conductive material (host) in the second hole transport layer 17 is the same with that in the first hole transport layer 14.

Figure 5:
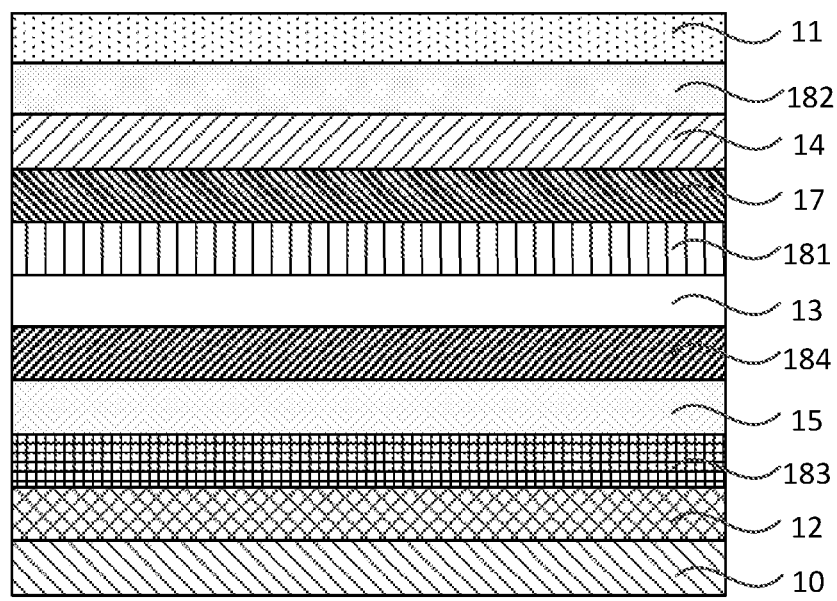
FIG. 5 is a cross sectional view of a structure of yet another organic light-emitting display panel according to one embodiment of the present disclosure.

FIG. 5 is a cross sectional view of a structure of yet another organic light-emitting display panel according to one embodiment of the present disclosure. Referring to FIG. 5, the organic light-emitting display panel further includes an electron blocking layer 181, a hole injection layer 182, an electron injection layer 183 and a hole blocking layer 184. The electron blocking layer 181 is located between the light-emitting layer 13 and the second hole transport layer 17; the hole injection layer 182 is located between the first hole transport layer 14 and the first electrode 11; the electron injection layer 183 is located between the electron transport layer 15 and the second electrode 12; the hole blocking layer 184 is located between the electron transport layer 15 and the light-emitting layer 13. It should be noted that, during specific manufacturing, the organic light-emitting display panel may include at least one of the electron blocking layer 181, the hole injection layer 182, the electron injection layer 183 and the hole blocking layer 184.

In the above technical solution, the materials of both the first electrode 11 and the second electrode 12 are silver or silver-containing metallic materials. Optionally, the material of the first electrode 11 and/or the second electrode 12 may be silver-magnesium alloy or silver-ytterbium alloy. The mass percent of silver in the first electrode 11 and/or the second electrode 12 may be greater than or equal to 10%. In use, at least one of the first electrode 11 and the second electrode 12 may function as an emergent light side electrode of the organic light-emitting display panel. Detailed illustration will be given below by typical examples.

Figure 6:
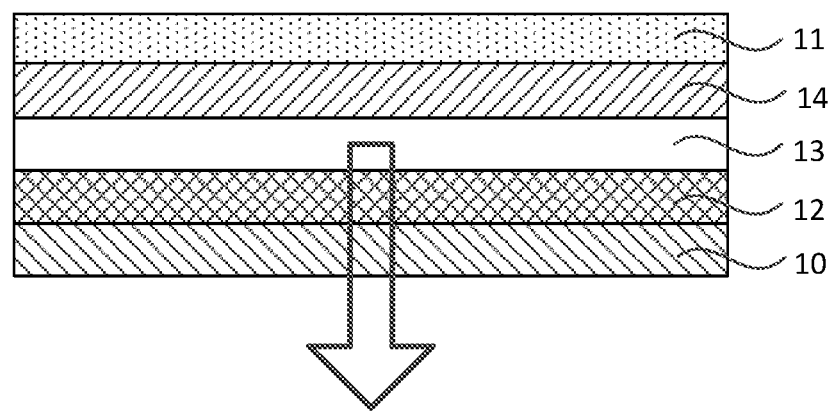
FIG. 6 is a cross sectional view of a structure of yet another organic light-emitting display panel according to one embodiment of the present disclosure.

FIG. 6 is a structural representation of yet another organic light-emitting display panel according to one embodiment of the present disclosure. Referring to FIG. 6, in the organic light-emitting display panel, only the second electrode 12 is taken as an emergent light side electrode, and light is emitted out via the second electrode 12 and the substrate 10 after being formed in the light-emitting layer 13. Such an organic light-emitting display panel is also referred to as an inverted bottom-emission type organic light-emitting display panel. In the present embodiment, the material of both the first electrode 11 and the second electrode 12 is silver or silver-containing metallic material. In order to make the first electrode 11 have good reflection effect and make the second electrode 12 have good light transmittance, the thickness of the first electrode 11 may be set as greater than 30 nm, and the thickness of the emergent light side electrode (the second electrode 12) may be set as less than 30 nm.

TABLE 1

| | Bias Voltage | External Quantum Efficiency | Lifetime |
| --- | --- | --- | --- |
| Experimental Group | 4 V | 6% | 100 hours |
| Contrast Group | 4 V | 6% | 70 hours |

Performance parameters of different organic light-emitting display panels are given in Table 1. Experimental Group is the inverted bottom-emission type organic light-emitting display panel according to the present application. Contrast Group is an existing upright bottom-emission type organic light-emitting display panel. "Bias Voltage" refers to a bias voltage applied by the first electrode 11 and the second electrode 12 on the organic light-emitting display panel. "Lifetime" refers to the working time of an organic light-emitting display panel for which the luminance of the organic light-emitting display panel attenuates from initial lightness to 95% of the initial lightness. It should be noted that, in Table 1, the bias voltage, the external quantum efficiency and the lifetime of the organic light-emitting display panels in Contrast Group and Experimental Group are all measured under the same experimental conditions (including the same current density).

Referring to Table 1, the bias voltage and the external quantum efficiency required for the inverted bottom-emission type organic light-emitting display panel in Experimental Group are identical with that of the upright bottom-emission type organic light-emitting display panel in Contrast Group, respectively. However, the lifetime of the inverted bottom-emission type organic light-emitting display panel in Experimental Group is much longer than the lifetime of the upright bottom-emission type organic light-emitting display panel in Contrast Group. This indicates that, the performance of the organic light-emitting display panel according to the embodiments of the present application is much better than that of the existing organic light-emitting display panel.

Figure 7:
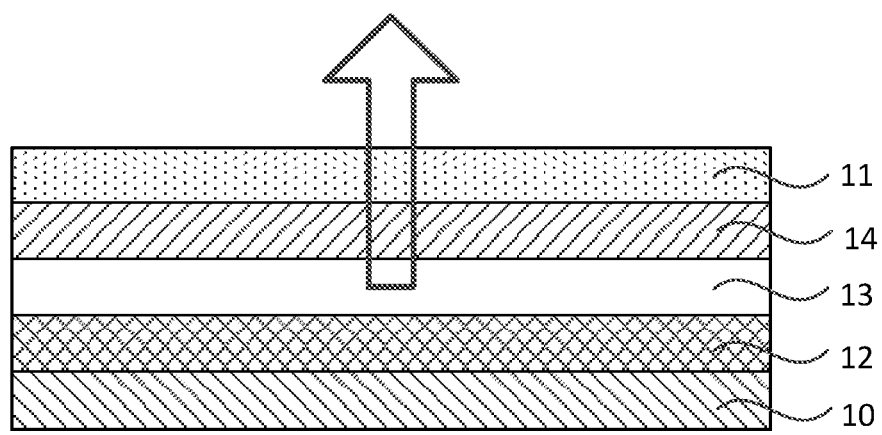
FIG. 7 is a cross sectional view of a structure of yet another organic light-emitting display panel according to one embodiment of the present disclosure.

FIG. 7 is a cross sectional view of a structure of yet another organic light-emitting display panel according to one embodiment of the present disclosure. Referring to FIG. 7, in the organic light-emitting display panel, only the first electrode 11 is taken as an emergent light side electrode, and light is emitted out via the first electrode 11 after being formed in the light-emitting layer 13. Such an organic light-emitting display panel is also referred to as an inverted top-emission type organic light-emitting display panel. In the present embodiment, the materials of both the first electrode 11 and the second electrode 12 are silver or silver-containing metallic materials. In order to make the second electrode 12 have good reflection effect and make the first electrode 11 have good light transmittance, the thickness of the second electrode 12 may be set as greater than 30 nm, and the thickness of the emergent light side electrode (the first electrode 11) may be set as less than 30 nm.

TABLE 2

| | Bias Voltage | External Quantum Efficiency | Lifetime |
| --- | --- | --- | --- |
| Experimental Group | 4 V | 10.5% | 100 hours |
| Contrast Group | 4 V | 10% | 50 hours |

Performance parameters of different organic light-emitting display panels are given in Table 2. Experimental Group is an inverted top-emission type organic light-emitting display panel according to the present application. Contrast Group is an existing upright top-emission type organic light-emitting display panel. Bias Voltage refers to a bias voltage applied by the first electrode 11 and the second electrode 12 on the organic light-emitting display panel. Lifetime refers to the working time of an organic light-emitting display panel for which the luminance of the organic light-emitting display panel attenuates from initial lightness to 95% of the initial lightness. It should be noted that, in Table 2, the bias voltage, the external quantum efficiency and the lifetime of the organic light-emitting display panels in Contrast Group and Experimental Group are all measured under the same experimental conditions (including the same current density).

Referring to Table 2, the bias voltage required for the inverted top-emission type organic light-emitting display panel in Experimental Group is identical with the bias voltage of the upright top-emission type organic light-emitting display panel in Contrast Group. However, the external quantum efficiency of the inverted top-emission type organic light-emitting display panel in Experimental Group is somewhat higher than that of the upright top-emission type organic light-emitting display panel in Contrast Group, and the lifetime of the inverted top-emission type organic light-emitting display panel in Experimental Group is much longer than that of the upright top-emission type organic light-emitting display panel in Contrast Group. This indicates that, the performance of the organic light-emitting display panel according to the embodiments of the present application is better than that of the existing organic light-emitting display panels.

Figure 8:
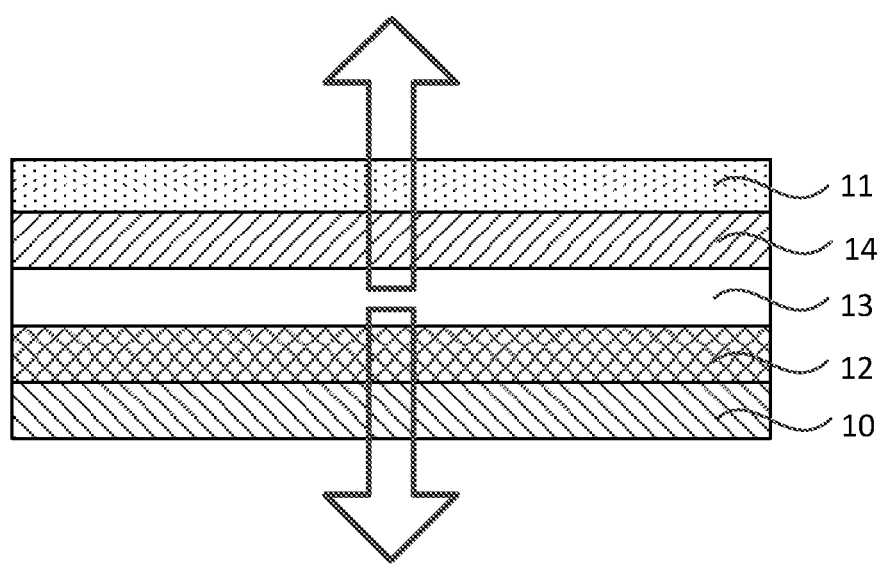
FIG. 8 is a cross sectional view of a structure of yet another organic light-emitting display panel according to one embodiment of the present disclosure.

FIG. 8 is a cross sectional view of a structure of yet another organic light-emitting display panel according to one embodiment of the present disclosure. Referring to FIG. 8, in the organic light-emitting display panel, both the first electrode 11 and the second electrode 12 are taken as emergent light side electrodes, and after being formed in the light-emitting layer 13, one part of the light is emitted out via the first electrode 11, and the other part of the light is emitted out via the second electrode 12. Exemplarily, if the materials of both the first electrode 11 and the second electrode 12 are silver or silver-containing metallic materials, in order to make both the first electrode 11 and the second electrode 12 have good light transmittance, the thickness of the emergent light side electrodes (including the first electrode 11 and the second electrode 12) may be set as less than 30 nm.

Figure 9:
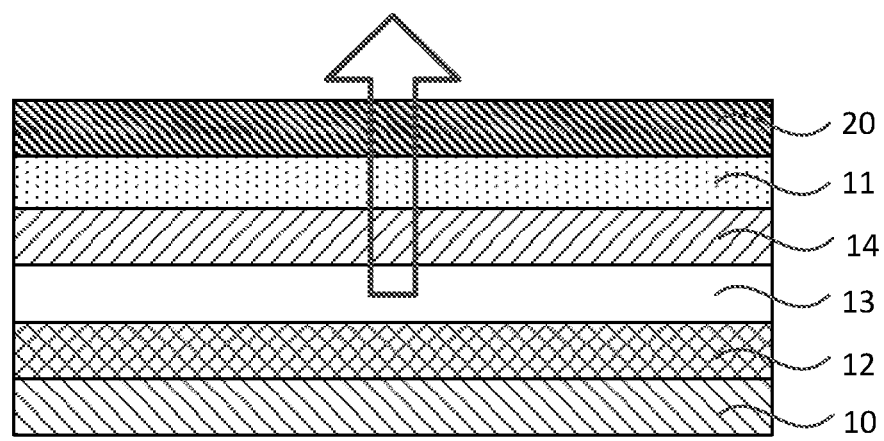
FIG. 9 is a cross sectional view of a structure of yet another organic light-emitting display panel according to one embodiment of the present disclosure.

FIG. 9 is a cross sectional view of a structure of yet another organic light-emitting display panel according to one embodiment of the present disclosure. As shown in FIG. 9, the organic light-emitting display panel may further include an optical coupling layer 20. The optical coupling layer 20 is located on one side of the emergent light side electrode of the organic light-emitting display panel that is facing away from the light-emitting layer 13. In FIG. 9, only the first electrode 11 is the emergent light side electrode, and the optical coupling layer 20 is located on one side of the first electrode 11 of the organic light-emitting display panel that is facing away from the light-emitting layer 13.

Considering that the organic light-emitting display panel does not include an optical coupling layer 20, the process in which the light is emitted from the emergent light side electrode (the first electrode 11) into the air will essentially be a process in which the light is emitted from an optically denser medium into an optically thinner medium. The light tends to be reflected on the interface between the emergent light side electrode (the first electrode 11) and the air, and hence the light transmittance will be lowered. In the technical solutions of this application, the arrangement of the optical coupling layer 20 is essentially to change the refractive index of the contact surface between the emergent light side of the organic light-emitting display panel and the air so as to suppress the reflection of light, thereby improving the light transmittance.

Based on the above technical solution, the material of the light-emitting layer 13 may be an organic material doped with a light-emitting material. The light-emitting material may red light-emitting material, green light-emitting material or blue light-emitting material. In use, optionally, the light emitted by the red light-emitting material, the light emitted by the green light-emitting material and the light emitted by the blue light-emitting material are mixed to obtain white light. Optionally, the mass ratio of the light-emitting material is greater than or equal to 1% and is less than or equal to 20%. The organic material in the light-emitting layer 13 may only include certain organic material, or it may be a mixture of a plurality of organic materials, which is not limited in the present disclosure.

Figure 10:
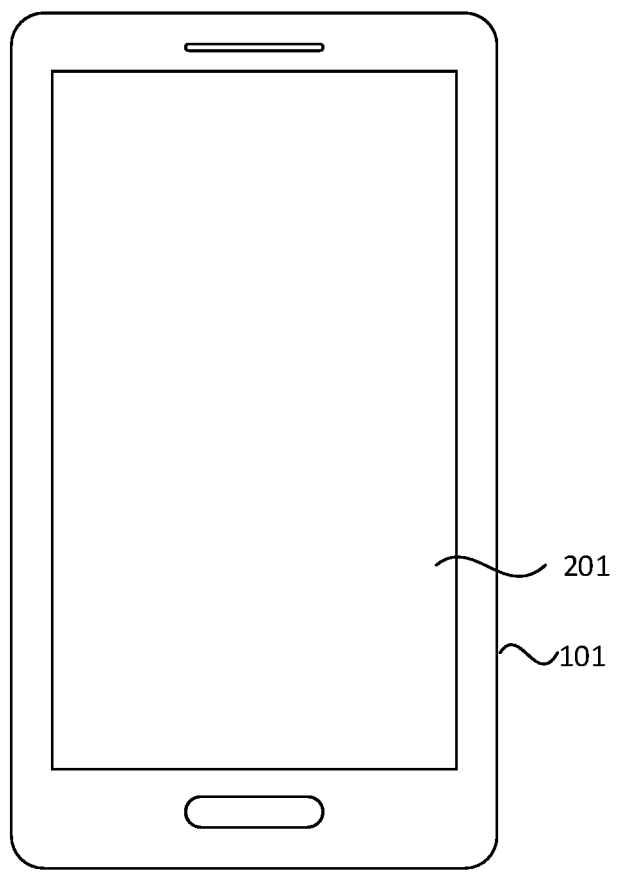
FIG. 10 is a top down view of an organic light-emitting display device according to one embodiment of the present disclosure.

One embodiment of the present disclosure further provides an organic light-emitting display device. FIG. 10 is a top view of an organic light-emitting display device according to one embodiment of the present disclosure. Referring to FIG. 10, the organic light-emitting display device 101 includes any organic light-emitting display panel 201 according to the embodiments of the present disclosure. Specifically, the organic light-emitting display device 101 may be a mobile phone, a notebook computer, an intelligent wearable device and an information inquiry machine in a public hall.

In the organic light-emitting display device according to the embodiments of the present disclosure, the material of both the first electrode and the second electrode in its internal organic light-emitting display panel is silver or silver-containing metallic material, the material of the first hole transport layer is a conductive material doped with a P-type semiconductor material or a P-type semiconductor material layer is provided between the first hole transport layer and the first electrode. With such an arrangement, it solves the problems of the existing inverted organic light-emitting display panel that it is very hard to achieve balanced adjustment of hole injection and electron injection so that the bias voltage required for the organic light-emitting display panel is high, the light-emitting efficiency is lower and the lifetime is very short. With the organic light-emitting display device according to the embodiments of the present disclosure, it can adjust the charge balance in the organic light-emitting display panel and lower the bias voltage required by the organic light-emitting display panel, thus improving the light-emitting efficiency of the organic light-emitting display panel and prolonging the lifetime of the organic light-emitting display panel.

It should be noted that the embodiments of the present disclosure and the technical principles used therein are described as above. It should be appreciated that the disclosure is not limited to the particular embodiments described herein, and any apparent alterations, modification and substitutions can be made without departing from the scope of protection of the disclosure. Accordingly, while the disclosure is described in detail through the above embodiments, the disclosure is not limited to the above embodiments and can further include other additional embodiments without departing from the concept of the disclosure.

What is claimed is:

1. An organic light-emitting display panel, comprising:
   a substrate, a second electrode, a light-emitting layer, a first hole transport layer, a first electrode and an optical coupling layer, wherein the substrate, the second electrode, the light-emitting layer, the first hole transport layer and the first electrode are successively laminated;
   wherein, the first electrode and the second electrode are both made of silver or silver-containing metallic materials;
   wherein the first hole transport layer is made of a conductive material doped with a P-type semiconductor material, wherein a P-type semiconductor material layer is provided between the first hole transport layer and the first electrode;
   wherein at least one of the first electrode and the second electrode is an emergent light side electrode of the organic light-emitting display panel; and
   wherein the optical coupling layer is located on one side of the emergent light side electrode of the organic light-emitting display panel that is facing away from the light-emitting layer.

2. The organic light-emitting display panel as claimed in claim 1, wherein
   in the case that the first hole transport layer is made of a conductive material doped with a P-type semiconductor material, a mass percent of the P-type semiconductor material in the first hole transport layer is greater than or equal to 1% and is less than or equal to 10%.

3. The organic light-emitting display panel as in claim 1, wherein
   a lowest unoccupied molecular orbital energy level of the P-type semiconductor material is less than −5 eV.

4. The organic light-emitting display panel as in claim 1, wherein
   a thickness of the first hole transport layer is ranges from 50 Å to 300 Å.

5. The organic light-emitting display panel as in claim 1, further comprising:
   an electron transport layer, which is located between the second electrode and the light-emitting layer.

6. The organic light-emitting display panel as in claim 5, wherein
   the electron transport layer is doped with at least one of an alkali metal, an alkaline earth metal and a rare earth metal.

7. The organic light-emitting display panel as in claim 6, wherein
   the electron transport layer is doped with at least one of lithium, cesium and ytterbium.

8. The organic light-emitting display panel as in claim 6, wherein
   a mass percent of the metal doped in the electron transport layer from 5% to 50%.

9. The organic light-emitting display panel as in claim 5, wherein
   the thickness of the electron transport layer is greater than 200 Å.

10. The organic light-emitting display panel as in claim 5, further comprising
    a second hole transport layer, located between the first hole transport layer and the light-emitting layer.

11. The organic light-emitting display panel as in claim 10, further comprising:
    at least one of an electron blocking layer, a hole injection layer, an electron injection layer and a hole blocking layer, wherein
    the electron blocking layer is located between the light-emitting layer and the second hole transport layer;
    the hole injection layer is located between the first hole transport layer and the first electrode;
    the electron injection layer is located between the electron transport layer and the second electrode; and
    the hole blocking layer is located between the electron transport layer and the light-emitting layer.

12. The organic light-emitting display panel as in claim 1, wherein
    at least one of the first electrode and the second electrode is made of a silver-magnesium alloy or a silver-ytterbium alloy.

13. The organic light-emitting display panel as in claim 12, wherein a mass percent of silver in at least one of the first electrode and the second electrode is greater than or equal to 10%.

14. The organic light-emitting display panel as in claim 1, wherein
a thickness of the emergent light side electrode is less than 30 nm.

15. An organic light-emitting display device, comprising an organic light-emitting display panel comprising:
a substrate, a second electrode, a light-emitting layer, a first hole transport layer, a first electrode and an optical coupling layer, wherein the substrate, the second electrode, the light-emitting layer, the first hole transport layer and the first electrode are successively laminated;
wherein, the first electrode and the second electrode are both made of silver or silver-containing metallic materials;
wherein the first hole transport layer is made of a conductive material doped with a P-type semiconductor material, and wherein a P-type semiconductor material layer is provided between the first hole transport layer and the first electrode;
wherein at least one of the first electrode and the second electrode is an emergent light side electrode of the organic light-emitting display panel; and
wherein the optical coupling layer is located on one side of the emergent light side electrode of the organic light-emitting display panel that is facing away from the light-emitting layer.

16. An organic light-emitting display panel, comprising:
a substrate, a second electrode, a light-emitting layer, a first hole transport layer, and a first electrode, a second hole transport layer, an electron transport layer located between the second electrode and the light-emitting layer, at least one of an electron blocking layer, a hole injection layer, an electron injection layer and a hole blocking layer;
wherein the substrate, the second electrode, the electrode transport layer, the light-emitting layer, the second hole transport layer, the first hole transport layer and the first electrode are successively laminated;
wherein the electron blocking layer is located between the light-emitting layer and the second hole transport layer;
wherein the hole injection layer is located between the first hole transport layer and the first electrode;
wherein the electron injection layer is located between the electron transport layer and the second electrode;
wherein the hole blocking layer is located between the electron transport layer and the light-emitting layer;
wherein the second hole transport layer is located between the first hole transport layer and the light-emitting layer;
wherein, the first electrode and the second electrode are both made of silver or silver-containing metallic materials; and
wherein the first hole transport layer is made of a conductive material doped with a P-type semiconductor material, wherein a P-type semiconductor material layer is provided between the first hole transport layer and the first electrode.

17. The organic light-emitting display panel as in claim 16, wherein
the electron transport layer is doped with at least one of an alkali metal, an alkaline earth metal and a rare earth metal.

18. The organic light-emitting display panel as in claim 17, wherein
the electron transport layer is doped with at least one of lithium, cesium and ytterbium.

19. The organic light-emitting display panel as in claim 17, wherein
a mass percent of the metal doped in the electron transport layer from 5% to 50%.

20. The organic light-emitting display panel as in claim 16, wherein
the thickness of the electron transport layer is greater than 200 Å.

* * * * *